(12) United States Patent
Chiu

(10) Patent No.: US 6,392,434 B1
(45) Date of Patent: May 21, 2002

(54) METHOD FOR TESTING SEMICONDUCTOR WAFERS

(75) Inventor: Kang Mien Chiu, Hsinchu (TW)

(73) Assignee: ProMOS Technologies, Inc., Hsinchu (TW)

(*) Notice: Subject to any disclaimer, the term of this patent is extended or adjusted under 35 U.S.C. 154(b) by 0 days.

(21) Appl. No.: 09/605,557

(22) Filed: Jun. 27, 2000

(30) Foreign Application Priority Data

Feb. 2, 2000 (TW) .......................................... 89101795

(51) Int. Cl.⁷ .............................................. G01R 31/26
(52) U.S. Cl. .................... 324/765; 324/762; 257/48; 438/18
(58) Field of Search ................................ 324/765, 762, 324/754, 755, 767; 438/14, 17, 15, 18; 257/40, 48, 207–209; 437/18

(56) References Cited

U.S. PATENT DOCUMENTS

| | | | | |
|---|---|---|---|---|
| 5,576,554 A | * | 11/1996 | Hsu | |
| 5,585,737 A | * | 12/1996 | Shibata | |
| 5,818,249 A | * | 10/1998 | Monohara | |
| 6,124,142 A | * | 9/2000 | Fujino | |
| 6,232,134 B1 | * | 5/2001 | Farber | |

* cited by examiner

Primary Examiner—Michael J. Sherry
Assistant Examiner—Trung Nguyen
(74) Attorney, Agent, or Firm—Blakely Sokoloff Taylor & Zafman, LLP

(57) ABSTRACT

A method for testing semiconductor wafers by analyzing the distribution of failure signatures in different regions of the wafers is disclosed. A number of wafers are tested, and each chip on the wafer is tested to determine whether the chip has certain failure signatures. Each wafer is divided into several regions, and each region is divided into several sub-regions. For each sub-region, the number of wafers that have a higher percentage of defective chips in the sub-region than the percentage of defective chips in the region encompassing the sub-region is calculated. A graphical output is generated to rank the sub-regions having the highest number of wafers with the percentage of defective chips in that sub-region higher than the percentage of defective chips in the region encompassing that sub-region.

14 Claims, 6 Drawing Sheets

METHOD FOR TESTING SEMICONDUCTOR WAFERS

FIELD OF THE INVENTION

This invention relates to semiconductor testing, and more particularly, to an improved method of finding causes of wafer defects by determining failure modes that have greater influence over the yield rate.

BACKGROUND OF THE INVENTION

Semiconductor wafer fabrication involves complex manufacturing processes to produce integrated circuits on the surface of silicon wafers. To ensure the quality of the integrated circuit chips, various testing methods have been devised to find defects on the wafer in order to improve the manufacturing processes. One method is to place testing circuitry at various locations on the wafer, and use test signals to determine the functionality of the circuitry. Typically, the testing circuit is designed into the chips on the wafer, and testing pads are made alongside the chips to allow probe pins to insert testing signals and measure the response signals. The chips are characterized as functional chips or defective chips according to these response signals. The defective chips are mapped on the wafer to create defect wafer maps. Typically, an experienced engineer then analyzes the defect wafer maps to determine the root cause of the defects. For example, a defect wafer map with defect patterns having curvilinear features may resemble a mechanical scratch; the defect patterns characterized by a grouping of low-density, sparse structures into amorphous clusters might resemble the trail off of a teardrop shaped stain.

Different types of electrical tests (such as direct current test, functionality test, etc.) may be conducted on the chips. For each type of test, the chips that fail the test are deemed defective, and may be marked on a map of the wafer to generate a defect wafer map. When an error occurs in a particular processing step or equipment, the defects caused by that error tend to concentrate on a particular region on a wafer. Thus, a process engineer may determine the cause of the defects by examining the wafer maps and analyzing the regions having a concentration of defects. Because hundreds of wafers are produces each day in a semiconductor plant, and many types of failure signatures need to be analyzed, an automated process of analyzing wafer maps to enable a user to quickly determine the cause of the wafer defects is desired.

The present invention is directed to an improved method of analyzing wafer maps to facilitate determination of the cause of defects on semiconductor wafers by analyzing defect density in different regions of the wafers and generating graphical comparison charts.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
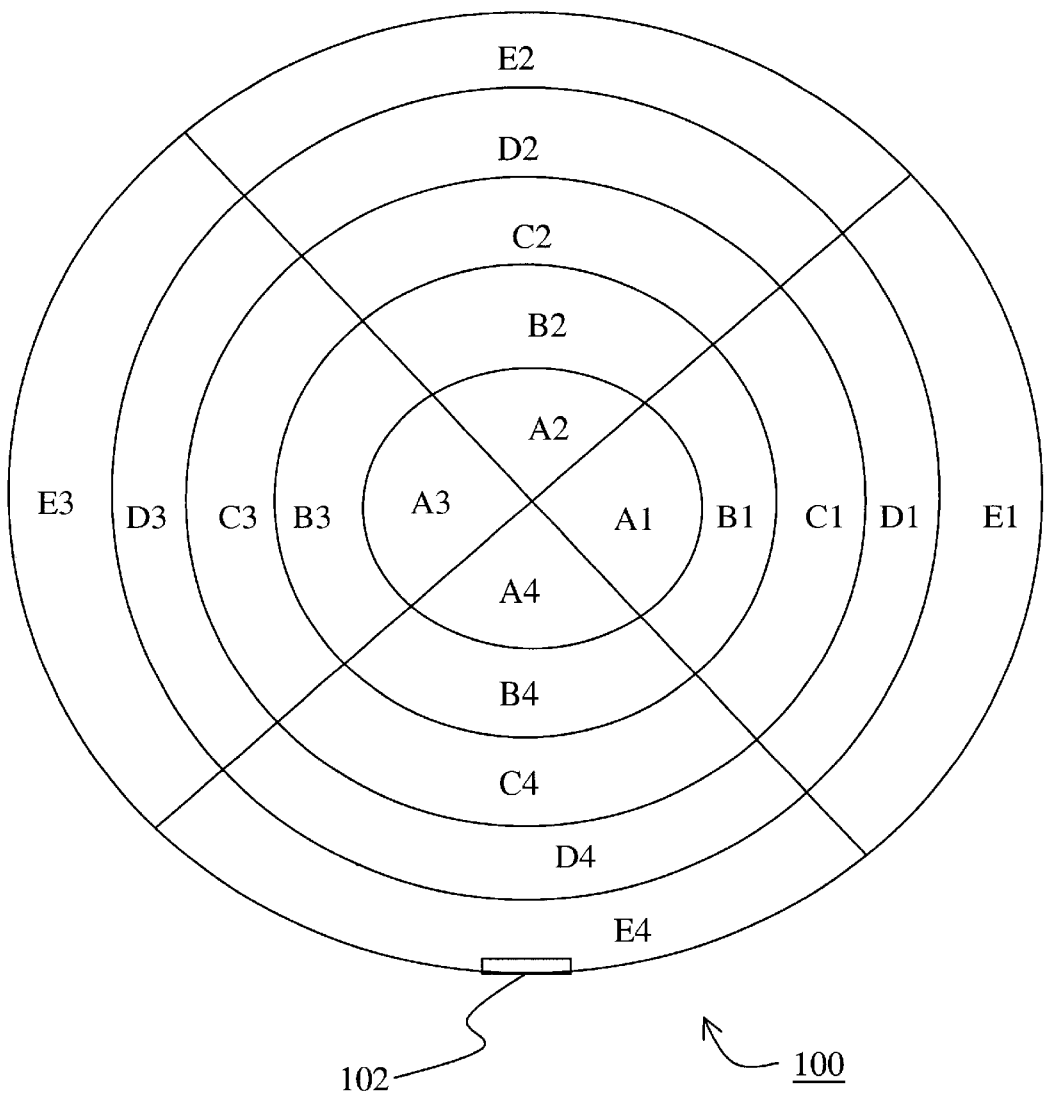
FIG. 1 is a representative map of a wafer divided into five concentric regions, with each concentric region subdivided into four sub-regions.

Referring to FIG. 1, a semiconductor wafer 100 has a mark 102 that is used as a reference mark to determine the orientation of the wafer 100. The wafer 100 is divided into five concentric regions A, B, C, D, and E. Each of the concentric regions is further divided into four quarters, resulting in 20 sub-regions. With the mark 102 as reference, the 20 sub-regions are named A1, A2, . . . , E3, E4, etc. There are no physically division lines on the wafers, but rather, each chip on the wafer is assigned to a sub-region according to its location on the wafer in relation to the reference mark 102. The division of a wafer into 20 sub-regions is used as an example only. The wafer may be divided into more sub-regions, and may use different shapes for the sub-regions. The number and shape of sub-regions are configured according to equipment and processing steps of a particular semiconductor fabrication plant. The sub-regions are configured such that a higher occurrence of density in a certain region may correspond to errors in certain processing steps or equipment.

An initial set of wafers is processed. A series of electrical and/or physical tests are performed on each chip on the wafers. Typically, a testing machine with test probes are used to pass signal currents through various testing points on the chips, and the response signals are measured. These response signals are compared with reference test data to determine whether the chip is functional or defective. For example, one test may determine whether there is a DC conduction path between two test points. Another test may determine whether the threshold voltage meets a certain criteria. Yet another test may determine whether leakage current is within set limits. Still another test may measure the functionality of the chips. The tests vary with each testing machine, and also vary with each type of chip tested. Sometimes, a test may combine several subtests. If a chip fails a certain test X, the chip is said to have the failure signature X.

Preferably, each failure signature corresponds to a particular processing step or equipment. Thus, if a chip has a particular failure signature (the chip failed a particular test), the user will be able to pinpoint the processing step or equipment that caused the error. Sometimes, as processing steps change and new equipment is added to the production line, more than one failure signatures are required to pinpoint the location of the processing step or equipment that caused the error.

Various electrical and/or physical tests may be performed on a chip, thus each chip may have more than one failure signature (i.e., fail more than one test). For each type of test, the chips that failed that test are marked as defective. The defective chips are mapped on a wafer to generate a defect wafer map as a reference wafer map. The wafer with the fewest defective chips is selected as the golden wafer. The corresponding wafer map becomes the golden wafer map. Wafer maps from subsequently manufactured wafers are then compared against this golden wafer map.

Figure 2:
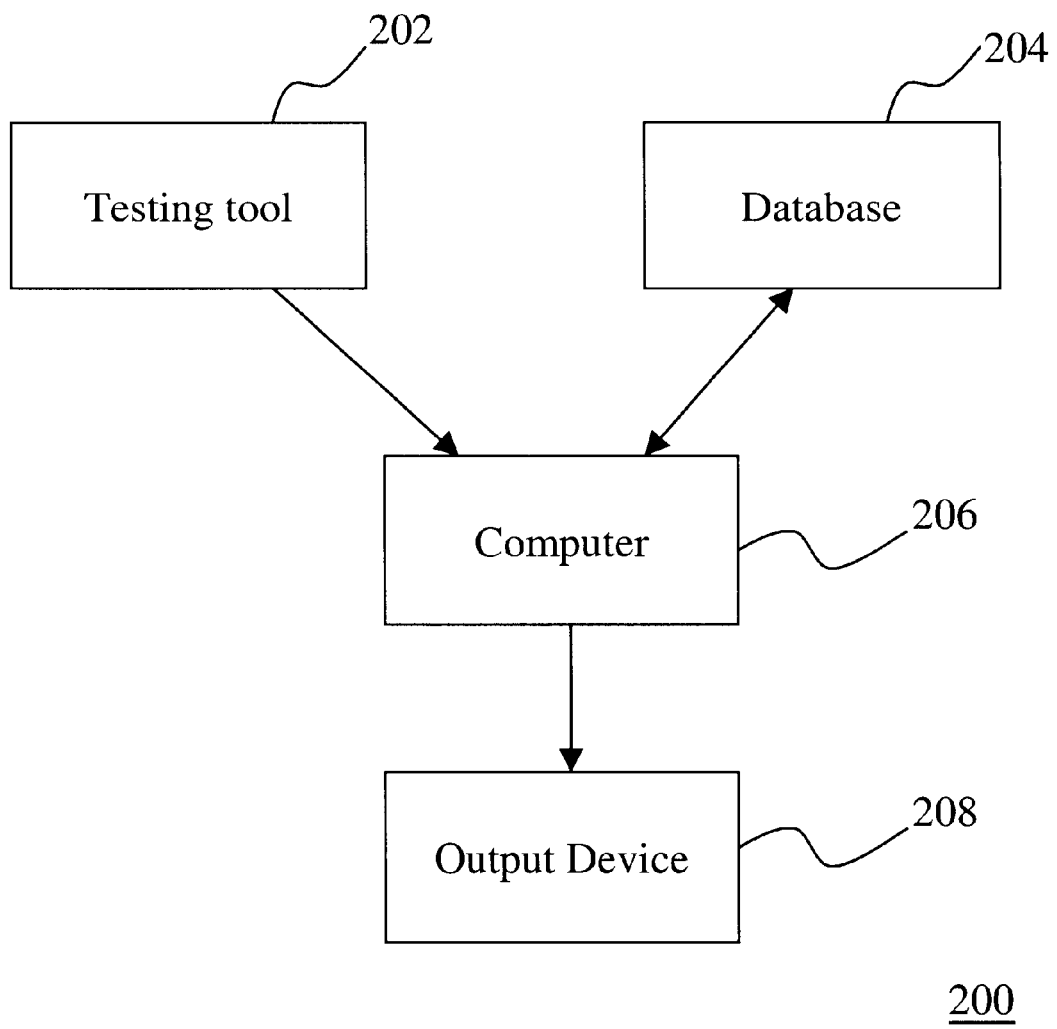
FIG. 2 is a block diagram of a system embodying the present invention.

Referring to FIG. 2, a wafer map comparison system 200 includes a testing tool 202, a database 204, a computer 206, and an output device 208. The testing tool 202 performs electrical and/or physical tests on the chips of the wafers, and sends the test data to the computer 206. The computer 206 may either process the test data, or send the data to the database 204 for storage. The computer 206 generates a wafer map based on the test results obtained from the testing tool 202. The wafer map is compared to a reference wafer map or golden wafer map stored in the database 204. After the computer 206 compares the wafer maps of subsequently manufactured wafers with the reference wafer map or golden wafer map, a comparison chart is compiled and sent to the output device 208 to generate an output on a video screen or a hardcopy printout.

The computer 206 may employ several comparison programs to generate comparison charts to better indicate the distribution of different failure signatures on the wafer. The purpose of the comparisons is to find the sub-region having a concentration of failure modes higher than the region average. In one embodiment of the invention, a first comparison program compares the defect density of one sub-region (e.g., sub-region E1) with the defect density of a region (e.g., region E). The term "defect density" refers to the percentage of chips having a particular failure signature within a region or sub-region. For example, if sub-region E1 has 40 chips, and there are 4 chips having the failure signature "YdcABI", then E1 has a defect density of 10% for the failure signature "YdcABI". For clarity of illustration, a chip that fails the "YdcABI" test will mean that the chip has a failure signature of "YdcABI".

For each type of failure signature, a comparison of the defect densities (sub-region versus concentric region) is performed on each sub-region of the wafer to determine which sub-regions have a higher defect density than the region defect density. Such comparisons are performed on a number of wafers that are manufactured during a certain time period. For each type of failure signatures and for each sub-region, the number of wafers with a sub-region having a higher defect density than the region defect density is counted. The results are sorted and displayed in a comparison chart.

Figure 3:
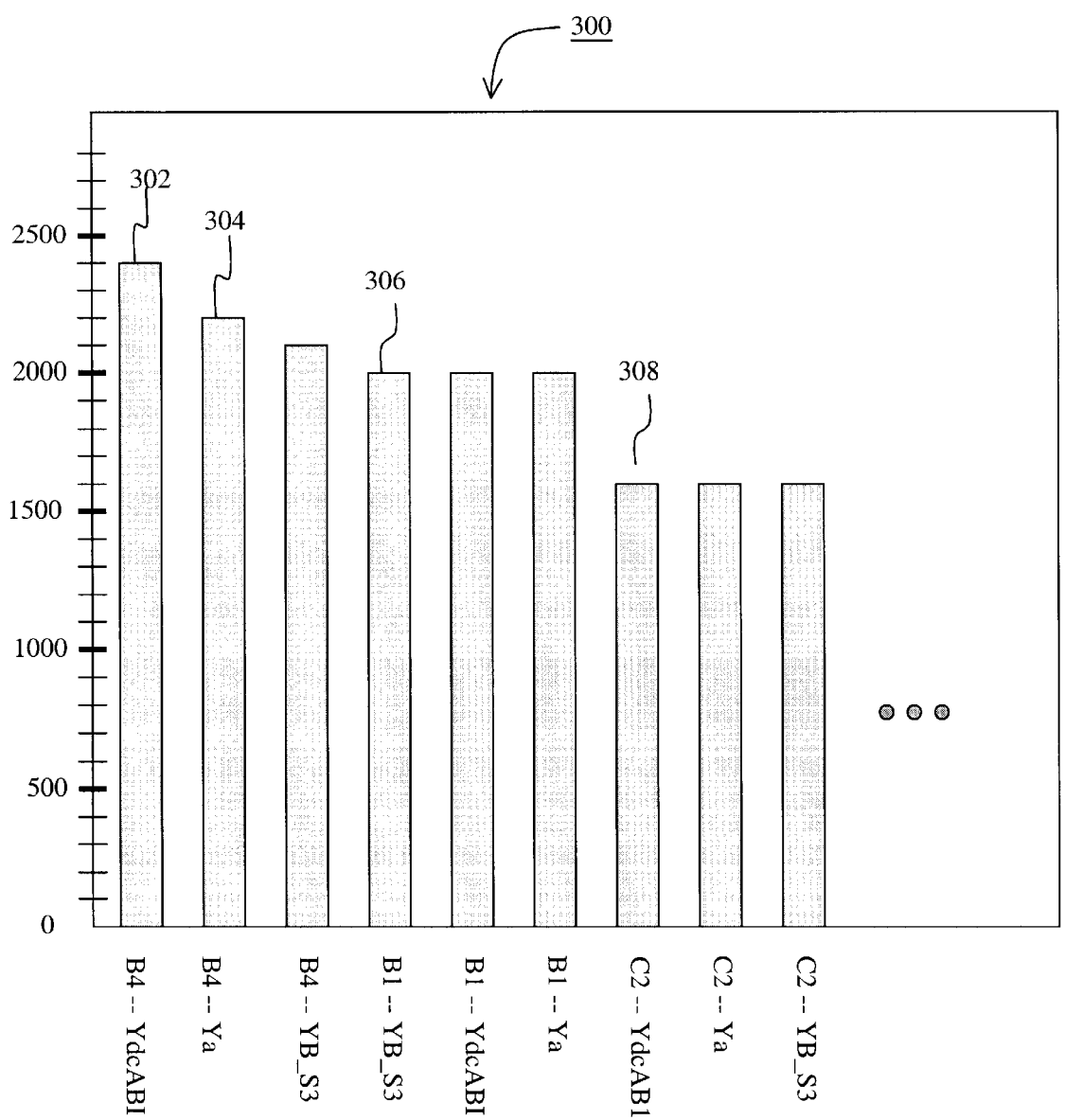
FIG. 3 shows a bar graph with each bar representing the number of wafers with a particular sub-region having more failure signatures than the average value.

Referring to FIG. 3, a comparison chart 300 shows the number of wafers with a particular sub-region having a higher defect density than the region defect density for a particular failure signature. This data shown in this chart is obtained from 3000 wafers. The first bar 302 in chart 300 shows that there are 2400 wafers with B4 having a higher percentage of chips with failure signature "YdcABI" than B. This means the percentage of chips in sub-region B4 that failed the "YdcABI" test is higher than the percentage in region B. The second bar 304 shows that there are 2400 wafers with B4 having a higher percentage of chips with failure signature "Ya" than B. The fourth bar 306 shows that there are 2000 wafers with B1 having a higher percentage of chips with failure signature "YB_S3" than B. The seventh bar 308 shows that there are 1600 wafers with C2 having a higher percentage of chips with failure signature "YdcABI" than C. The other bars on the chart 300 are interpreted accordingly. By viewing the chart 300, a process engineer may easily determine that sub-region B4 has a high defect density, and thus prioritize his tasks by first adjusting the processing steps or equipment related to sub-region B4 and failure signature "YdcABI".

The computer 206 employs a second comparison program to compare the defect density of a sub-region with the defect density of a golden wafer. For a well maintained wafer production line, the defects should distribute evenly, or randomly, throughout a wafer. If the defective chips concentrate in a particular sub-region, or if the distribution of defective chips forms a certain pattern, then this indicates that a certain processing step or equipment may have problems.

Figure 4:
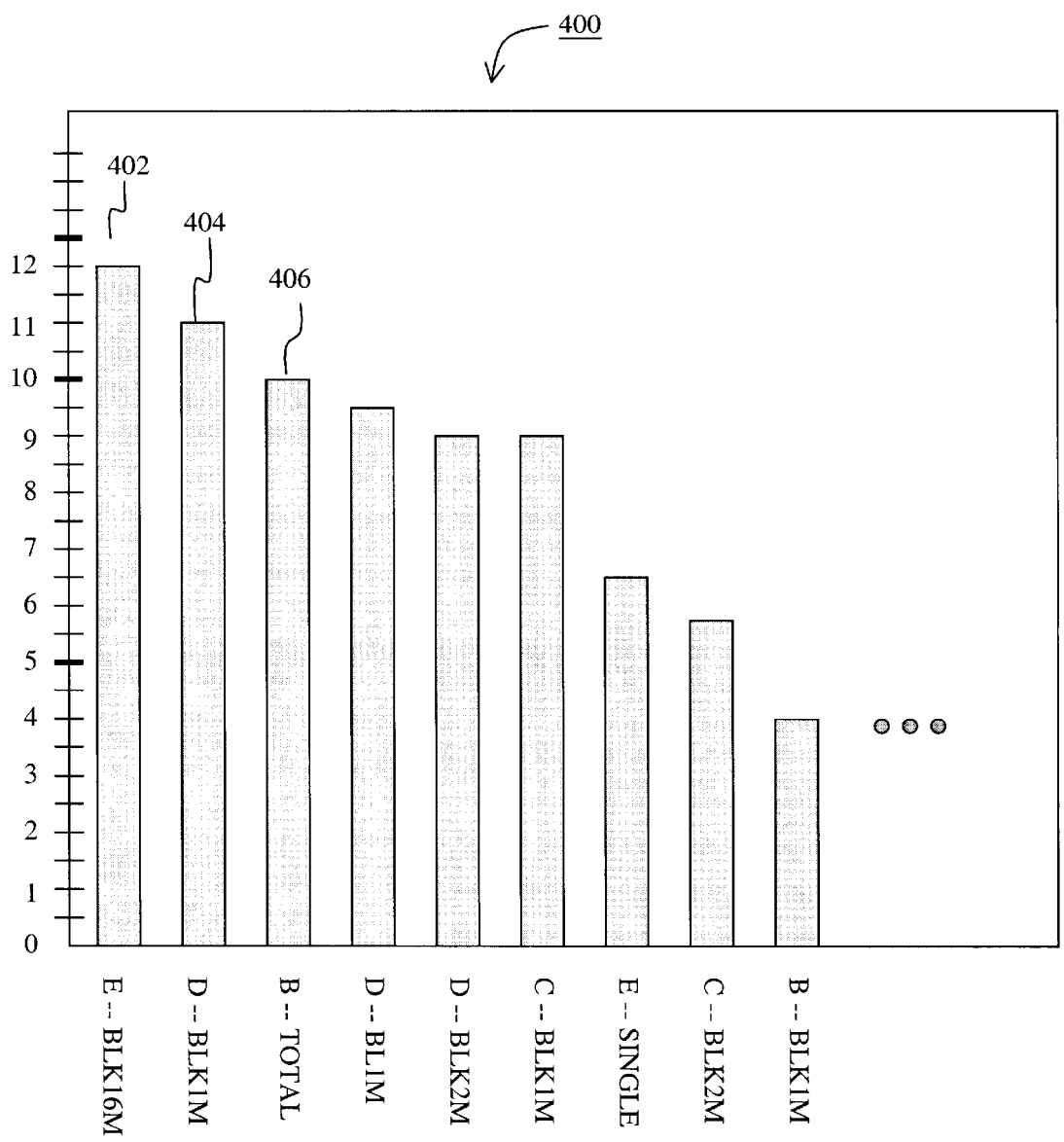
FIG. 4 shows a bar graph representing the percentage of failure signatures in different sub-regions of a wafer as compared to the golden wafer.

Referring to FIG. 4, a comparison chart 400 shows the percentage of defects in a region for each failure signature compared to a golden data generated from a golden wafer. The golden data is collected from 30 or 50 wafer lots with the best yield rate to calculate the data distribution for each failure signature. The first bar 402 in chart 400 shows that in region E the number of wafers having the failure signature "BLK16M" is 12% as much as the number of wafers in the golden wafer having the failure signature "BLK16M". For example, this will happen if there are 100 wafers in the golden wafer that failed the "BLK16M" test, and there are 12 wafers in region E that failed the "BLK16M" test. The wafer is counted if the region of a wafer having said failure signature is out of the golden data range ($3\sigma$ of this failure signature of golden wafer) when compare the data of each wafer with golden data range. The second bar 404 shows that the number of wafers in region D having the failure signature "BLK1M" is 11% as much as the number of wafers in the golden wafer having the failure signature "BLK1M". The third bar 406 shows that the number of wafers in region B having the failure signature "TOTAL" is 10% as much as the number of wafers in the golden wafer having the failure signature "TOTAL". The seventh bar 408 shows that the number of wafers in region E having the failure signature "SINGLE" is 6.5% as much as the number of wafers in the golden wafer having the failure signature "SINGLE". The other bars on the chart 400 are interpreted accordingly. By viewing the chart 400, a process engineer may easily determine that region E has a high defect density, and thus prioritize his tasks by first adjusting the processing steps or equipment related to region E and failure signature "BLK16M".

Figure 5:
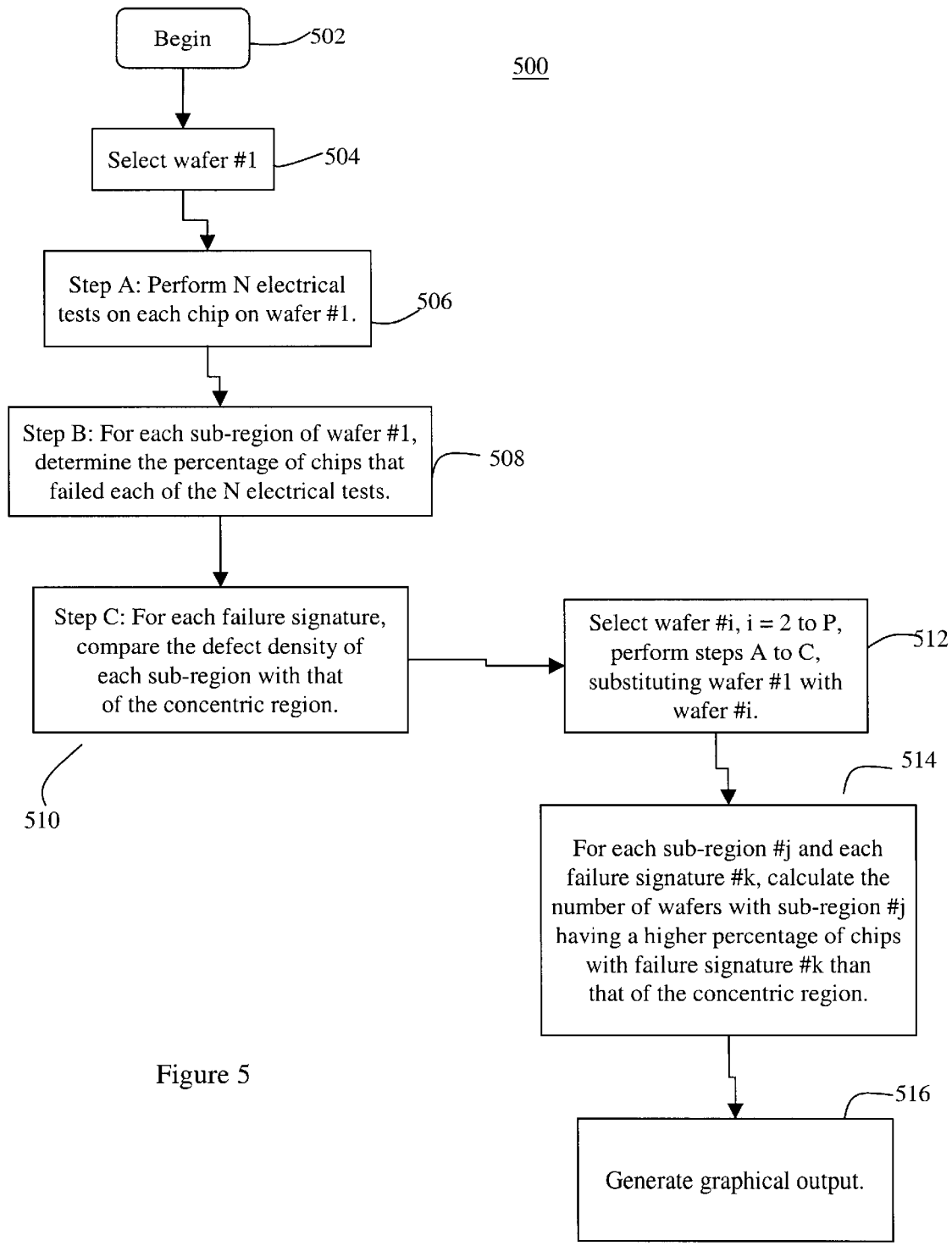
FIG. 5 shows a flow diagram for comparing wafers to generate the bar graph of FIG. 3.

Referring to FIG. 5, a flowchart for generating the comparison chart of FIG. 3 is shown. A total of "P" wafers are tested in this process. A total of N electrical tests are conducted on the P wafers. Process 500 begins at box 502. Various initialization procedures may be performed at this point. In box 504, the first wafer is selected. In box 506, N electrical tests are conducted on each chip on the wafer. In box 508, for each sub-region on the first wafer, the percentage of chips that failed each of the N electrical tests is calculated. When a chip fails an electrical test, that chip has the corresponding failure signature. In box 510, for each failure signature, the defect density of each sub-region is compared with that of the concentric region. Information of the sub-regions with higher defect densities is stored. In box 512, the wafers #2 to #P are selected, and the steps A to C are repeated, namely, the electrical tests are performed, and the defect density for each sub-regions is compared with that of the concentric region. In box 514, for each sub-region and each failure signature, the number of wafers with a certain sub-region having a higher percentage of chips with a certain failure signature than the concentric region is calculated. In box 516, a comparison chart such as the one shown in FIG. 3 is generated.

Figure 6:
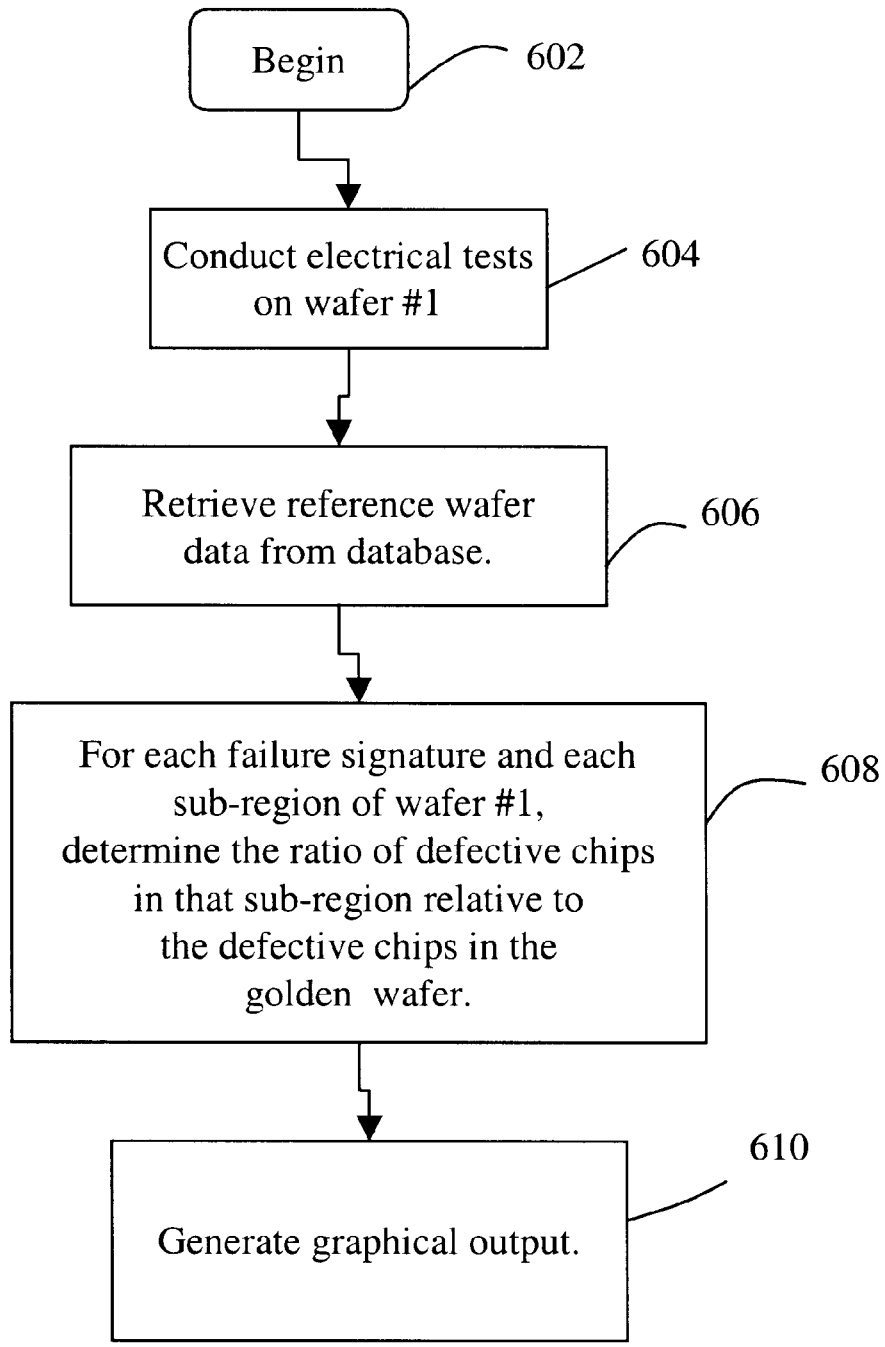
FIG. 6 show a flow diagram for comparing wafers to generate the bar graph of FIG. 4.

Referring to FIG. 6, a flowchart for generating the comparison chart of FIG. 4 is shown. Electrical tests are conducted on a wafer, and the test results are compared with the test data obtained from a golden wafer. Process 600 begins at box 602. Various initialization procedures may be performed at this point. In box 604, electrical tests are conducted on each chip on the wafer. In box 606, the test data for the reference wafer is retrieved from the database. In box 608, for each failure signature and each sub-region on the wafer, the ratio of the defective ships in that sub-region relative to the defective chips in the golden wafer is calculated. In box 610, a comparison chart such as the one shown in FIG. 4 is generated.

While the preferred embodiment of the invention has been illustrated and described, it will be appreciated that various changes can be made therein without departing from the spirit and scope of the invention. For example, the types of comparisons of defect densities may be varied according to application. More than one sub-region may be combined in comparison process. The scope of the invention is defined by the claims that follow.

I claim:

1. A method for testing a plurality of semiconductor wafers having a plurality of chips thereon, comprising the steps of:

(a) dividing each of the wafers into a plurality of regions;
    (b) dividing each region into a plurality of sub-regions;
    (c) performing an electrical test on each of the chips on each of the wafers;
    (d) for each sub-region of each wafer, calculating the percentage of chips that failed said electrical test;
    (e) for each region of each wafer, calculating the percentage of chips that failed said electrical test;
    (f) for each sub-region, calculating the number of wafers whose corresponding sub-region has a higher percentage of chips that failed said electrical test than the percentage of chips that failed said electrical test in the region that contains said each sub-region; and
    (g) generating an output showing a selected sub-region having the highest number of wafers whose corresponding sub-region has a higher percentage of chips that failed said electrical test than the percentage of chips that failed said electrical test in the region that contains said each sub-region.

2. The method of claim 1, wherein step (a) includes the step of dividing the wafer into a plurality of concentric regions, and step (b) includes the step of dividing each concentric region into a plurality of sub-regions.

3. The method of claim 2, wherein step (b) includes the step of dividing each concentric region into four sub-regions.

4. The method of claim 1, wherein after step (c), further includes the step:

(c1) performing a second electrical test on each of the chips on each of the wafers.

5. The method of claim 4, wherein after step (d), further includes the step:

(d1) for each sub-region of each wafer, calculating the percentage of chips that failed said second electrical test.

6. The method of claim 5, wherein after step (e), further includes the step:

(e1) for each region of each wafer, calculating the percentage of chips that failed said second electrical test.

7. The method of claim 6, wherein after step (f), further includes the step:

(f1) for each sub-region, calculating the number of wafers that has a higher percentage of chips that failed said second electrical test in said each sub-region than the percentage of chips that failed said second electrical test in the region encompassing said each sub-region.

8. The method of claim 7, wherein step (g) includes the step of generating an output showing the sub-region having the highest number of wafers with the percentage of chips that failed either said electrical test or said second electrical test in the sub-region higher than the percentage of chips that failed the corresponding test in the region encompassing said sub-region.

9. A method for testing a plurality of semiconductor wafers having a plurality of chips thereon, comprising the steps of:

(a) providing a plurality of golden wafers;
    (b) performing an electrical test on each chip on each of said golden wafers;
    (c) dividing the semiconductor wafers into a plurality of regions;
    (d) performing said electrical test on each of the chips on the semiconductor wafers;
    (e) for each region of each of the semiconductor wafers, determining the number of semiconductor wafers that failed said electrical test in said each region in greater proportion than the failure rate of said plurality of golder wafers; and
    (f) generating an output showing the region having the highest proportion of failed chips in comparison to the number of failed chips in said golden wafers.

10. The method of claim 9, wherein step (c) includes the step of dividing the wafer into a plurality of concentric regions.

11. The method of claim 9, wherein after step (b), further includes the step:

(b1) performing a second electrical test on each chip on said golden wafer.

12. The method of claim 11, wherein after step (d), further includes the step:

(d1) performing said second electrical test on each of the chips on the semiconductor wafer.

13. The method of claim 12, wherein after step (e), further includes the step:

(e1) for each region of the semiconductor wafer, calculating the ratio of the number of chips in said each region that failed said second electrical test over the number of chips in said reference wafer that failed said second electrical test.

14. The method of claim 13, wherein step (f) includes the step of generating an output showing the region having the highest ratio of the number of chips in said region that failed either said electrical test or said second electrical test over the number of chips in said reference wafer that failed the corresponding test.

* * * * *